(12) United States Patent
Lee et al.

(10) Patent No.: US 9,899,590 B2
(45) Date of Patent: Feb. 20, 2018

(54) THERMOELECTRIC ELEMENT AND THERMOELECTRIC MODULE

(71) Applicant: ELECTRONICS AND TELECOMMUNICATIONS RESEARCH INSTITUTE, Daejeon (KR)

(72) Inventors: Seung Min Lee, Suwon-si (KR); Seungeon Moon, Daejeon (KR); Junsoo Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/222,601

(22) Filed: Jul. 28, 2016

(65) Prior Publication Data
US 2017/0125659 A1 May 4, 2017

(30) Foreign Application Priority Data

Nov. 3, 2015 (KR) .......................... 10-2015-0153488
Mar. 9, 2016 (KR) .......................... 10-2016-0028435

(51) Int. Cl.
*H01L 35/32* (2006.01)
*H01L 35/04* (2006.01)

(52) U.S. Cl.
CPC .............. *H01L 35/32* (2013.01); *H01L 35/04* (2013.01)

(58) Field of Classification Search
CPC ..................... H01L 35/28; H01L 35/10; H01L 35/02–35/34

(Continued)

(56) References Cited

U.S. PATENT DOCUMENTS

2002/0046762 A1* 4/2002 Rossi ................ H01L 35/16
                                                      136/201
2005/0150539 A1* 7/2005 Ghoshal ............ H01L 23/38
                                                      136/205

(Continued)

FOREIGN PATENT DOCUMENTS

KR    10-0984112 B1    9/2010
KR    10-1232875 B1    2/2013

OTHER PUBLICATIONS

Jung Hyun Oh, et al., "Suppression of phonon transport in multiple Si/PtSi heterostructures", Journal of Applied Physics, vol. 117, pp. 245102-1-245102-6, 2015.

(Continued)

*Primary Examiner* — Niki Bakhtiari
(74) *Attorney, Agent, or Firm* — Rabin & Berdo, P.C.

(57) ABSTRACT

Provided is a thermoelectric element. The thermoelectric element includes an insulation substrate, a semiconductor layer on the insulation substrate, insulation layers disposed on the semiconductor layer and spaced apart from each other in a first direction parallel with a surface of the insulation substrate, metal thin films disposed on the insulation layers, and metal-semiconductor compound layers between the semiconductor layer and the second parts. Each of the metal thin films includes a first part overlapping the insulation layer and a second part extending from the first part in the first direction or in a direction opposite to the first direction to be connected to the semiconductor layer, and the second parts facing each other in the metal thin films adjacent to each other are spaced apart from each other.

12 Claims, 5 Drawing Sheets

(58) Field of Classification Search
USPC .................................................. 136/200–242
See application file for complete search history.

(56) References Cited

U.S. PATENT DOCUMENTS

| | | |
|---|---|---|
| 2012/0167936 A1 | 7/2012 | Park et al. |
| 2014/0014152 A1* | 1/2014 | Hsu .................. H01L 35/30 |
| | | 136/204 |
| 2015/0129010 A1 | 5/2015 | Jun et al. |

OTHER PUBLICATIONS

J. M. O. Zide, et al., "Demonstration of electron filtering to increase the Seebeck coefficient in In0.53Ga0.47As/ In0.53Ga0.28Al0.19As superlattices", Physical Review B, vol. 74, pp. 205335-1-205335-5, 2006.

Je-Hyeong Bahk, et al., "Electron energy filtering by a nonplanar potential to enhance the thermoelectric power factor in bulk materials", Physical Review B, vol. 87, pp. 075204-1-075204-13, 2013.

Soojung Kim, "The study of thermoelectric properties in low-dimensional silicon", University of Science and Technology, pp. 1-95, Feb. 2015.

* cited by examiner

THERMOELECTRIC ELEMENT AND THERMOELECTRIC MODULE

CROSS-REFERENCE TO RELATED APPLICATIONS

This U.S. non-provisional patent application claims priority under 35 U.S.C. § 119 of Korean Patent Application Nos. 10-2015-0153488, filed on Nov. 3, 2015, and 10-2016-0028435, filed on Mar. 9, 2016, the entire contents of which are hereby incorporated by reference.

BACKGROUND

Example embodiments of inventive concepts relates to a thermoelectric element and a thermoelectric module, and more particularly, to a thermoelectric element and a thermoelectric module which are based on a semiconductor material.

In recent years, as interest in clean energy is growing, research on thermoelectric elements is actively conducted. The thermoelectric elements may transform thermal energy into electric energy, or on the contrary, may generate temperature difference by applying electric energy.

When a metal wire is connected to both ends of a thermoelectric material, and one end of the thermoelectric material is heated up while the other end of the thermoelectric material is maintained in a cooled down state, a voltage due to a temperature difference between both ends, i.e., thermoelectromotive force may be generated, and thus current flows in a closed circuit. This phenomenon is called the Seebeek effect to be a principal of thermoelectric power generation by a thermoelectric element.

When current flows in a loop that is provided with metals connected to each other with a semiconductor (a thermoelectric element) therebetween, a potential difference is generated due to a Fermi-energy difference. In this regard, since electric charges bring energy required to be moved from a metal surface to the other metal surface, (Endothermic) cooling may take place on the metal surface. On the contrary, since the electric charge releases the energy brought from the metal surface to the other metal surface, (Exothermic) heating may take place on the other metal surface. This phenomenon is called the Peltier effect to be an operation principal of cooling devices by the thermoelectric element.

SUMMARY

Example embodiments of inventive concepts may provide a thermoelectric element and a thermoelectric module which have high thermoelectric efficiency.

Example embodiments of inventive concepts also may provide a thermoelectric element and a thermoelectric module using a semiconductor material.

The object of the present invention is not limited to the aforesaid, but other objects not described herein will be clearly understood by those skilled in the art from descriptions below.

According to example embodiments of the inventive concepts, a thermoelectric element may include an insulation substrate, a semiconductor layer on the insulation substrate, insulation layers disposed on the semiconductor layer and spaced apart from each other in a first direction parallel with a surface of the insulation substrate, metal thin films disposed on the insulation layers, and metal-semiconductor compound layers between the semiconductor layer and the second parts. Each of the metal thin films may include a first part overlapping the insulation layer and a second part extending from the first part in the first direction or in a direction opposite to the first direction to be connected to the semiconductor layer. The second parts facing each other in the metal thin films adjacent to each other may be spaced apart from each other.

In an embodiment, the insulation layers may have a line shape extending in a second direction crossing the first direction. The metal thin films may be disposed in the first and second directions to form a plurality of rows and columns.

In an embodiment, the semiconductor layer may include trenches that are formed thereinside and extend in a second direction crossing the first direction to traverse the first parts of the metal thin films in a plan view.

In an embodiment, the trench may penetrate through the semiconductor layer to expose a surface of the insulation substrate.

In an embodiment, the semiconductor layer may have the p-type or n-type conductivity.

In an embodiment, the semiconductor layer may have a thickness of about 0.1 to about 30 micrometers.

In an embodiment, the second parts facing each other may be spaced apart from each other at a distance of about 10 to 100 nanometers.

In an embodiment, the semiconductor layer may include silicon (Si). The metal thin films may include at least one of platinum (Pt), titanium (Ti), cobalt (Co), nickel (Ni), tungsten (W), molybdenum (Mo), tantalum (Ta), manganese (Mn), iron (Fe), ruthenium (Ru), magnesium (Mg), erbium (Er), gold (Au), silver (Ag), or compounds thereof.

In an embodiment, the metal-semiconductor compound layers may include a metal silicide.

According to example embodiments of the inventive concepts, a thermoelectric module may include a first substrate, a first electrode and a second electrode disposed on the first substrate, a first leg disposed on the first electrode, a second leg disposed on the second electrode, a third electrode disposed on the first leg and the second leg, and a second substrate disposed on the third electrode. Each of the first and second legs may include the above-described thermoelectric element. The semiconductor layer of the first leg and the semiconductor layer of the second leg may have conductive types different from each other.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
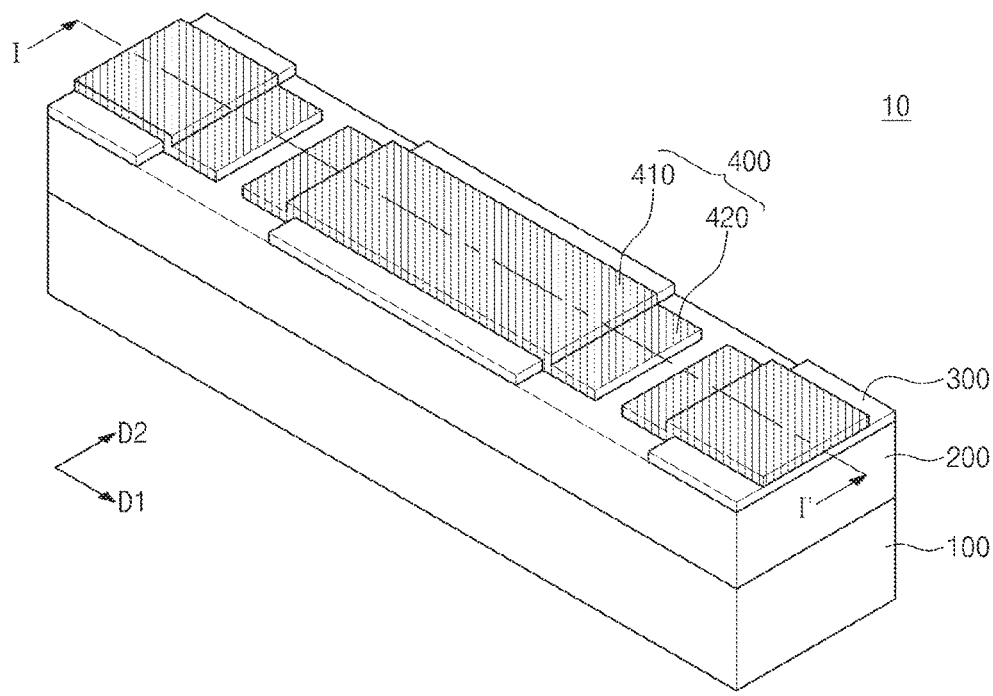
FIG. 1 is a perspective view illustrating a thermoelectric element according to some example embodiments of the inventive concept.

Exemplary embodiments of the present disclosure will be described with reference to the accompanying drawings so as to sufficiently understand constitutions and effects of the present disclosure. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. A person with ordinary skill in the technical field to which the present disclosure pertains will understand that the present disclosure can be carried out under any appropriate environments. Like reference symbols refer to like elements throughout.

In this specification, the technical terms are used only for explaining a specific exemplary embodiment while not limiting the present disclosure. In this specification, the terms of a singular form may include plural forms unless specifically mentioned. It will be understood that terms 'comprises' and/or 'comprising', when used in this specification, specifies the presence of stated components, steps, operations and/or elements, but does not exclude the presence or addition of one or more other components, steps, operations and/or elements.

In this specification, it will be understood that when a surface (or layer) is referred to as being on another surface (or layer) or a semiconductor layer, it can be directly on another surface (or layer) or the semiconductor layer, or intervening surface (or layer) may also be present.

Although terms like a first, a second, and a third are used to describe various regions and surfaces (or layers) in various embodiments of this specification, the regions and the surfaces are not limited to these terms. These terms are used only to distinguish one predetermined region or surface (or layer) from another region or surface (or layer). Therefore, a layer referred to as a first layer in one embodiment can be referred to as a second layer in another embodiment. Each of embodiments described and exemplified herein includes a complementary embodiment thereof. Like reference numerals refer to like elements throughout.

Additionally, the embodiments described in this specification will be explained with reference to the cross-sectional views and/or plan views, which are schematic diagrams of idealized example embodiments of the present disclosure. In the figures, the thicknesses of layers and regions are exaggerated for effective description of the technical contents. As such, variations from the shapes of the illustrations, as a result, for example, of manufacturing techniques and/or tolerances, are to be expected. Therefore, the embodiments of the present disclosure are not limited to the specific shape illustrated in the exemplary views, but may include other shapes that may be created according to manufacturing processes. For example, an etched region illustrated in a right angle may be in the rounded shape or in the shape of having a predetermined curvature. Therefore, the regions illustrated in the drawings are schematic in nature, and are not intended to limit the scope of the present disclosure.

Unless otherwise defined, all terms used herein have the same meanings as commonly understood to a person skilled in the art.

Hereinafter, the present disclosure will be described in detail by explaining preferred embodiments of the inventive concept with reference to the attached drawings.

Figure 2:
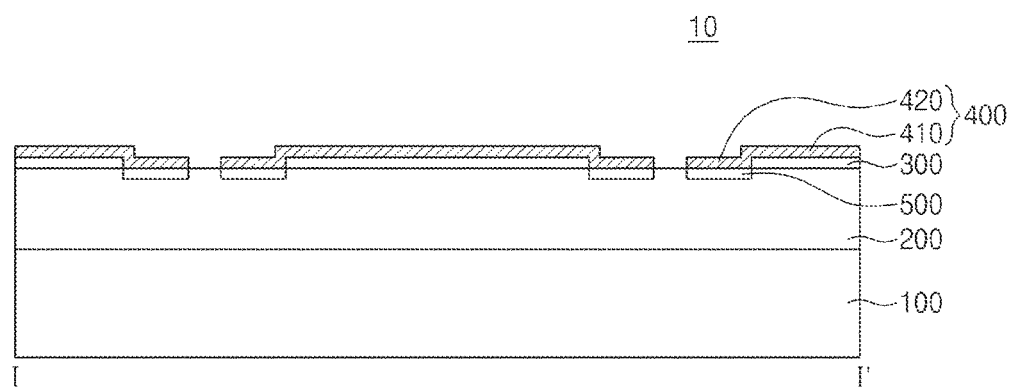
FIG. 2 is a cross-sectional view taken along line I-I' of FIG. 1.

FIG. 1 is a perspective view illustrating a thermoelectric element according to some example embodiments of the inventive concept. FIG. 2 is a cross-sectional view taken along line I-I' of FIG. 1. Although a thermoelectric element may include a plurality of unit thermoelectric elements, hereinafter, the unit thermoelectric element illustrated in FIG. 1 will be mainly explained for convenience of description.

Referring to FIGS. 1 and 2, an insulation substrate 100 is provided. The insulation substrate 100 may be a bulk substrate or a porous substrate. Alternatively, the insulation substrate 100 may be a membrane. According to some embodiments, the insulation substrate 100 may preferably decrease in thickness so as to reduce a thermal conduction property through the insulation substrate 100. The insulation substrate 100 may include a material having a low thermal conductivity. Preferably, the insulation substrate 100 may have a thermal conductivity of 1 W/mK or less. For example, the insulation substrate 100 may include silicon dioxide ($SiO_2$), silicon nitride (SiN), or aluminum oxide ($Al_2O_3$).

A semiconductor layer 200 may be disposed on the insulation substrate 100. The semiconductor layer 200 may be a thin film including a semiconductor material. For example, the semiconductor layer 200 may include silicon (Si). However, the present invention is not limited thereto, and the semiconductor layer 200 may include germanium (Ge), antimony (Sb), bismuth (Bi), Tellurium (Te), or their compounds. Also, the semiconductor layer 200 may have a thickness of about 0.1 micrometer to about 30 micrometers. When the semiconductor layer 200 has a thickness less than that of the above-described range, the semiconductor layer 200 may increase in a resistance. On the contrary, when the semiconductor layer 200 has a thickness greater than that of above-described range, the semiconductor 200 may increase in a thermal conduction property therethrough to reduce efficiency of the thermoelectric element.

The semiconductor layer 200 may have conductive types of n-type or p-type. For example, the semiconductor layer 200 may have a doping concentration of about $10^{18}$ atoms/$cm^3$ to about $10^{21}$ atoms/$cm^3$. This is to decrease the electrical resistance to improve efficiency of the thermoelectric element 10.

The semiconductor layer 200 may generate a thermoelectromotive force through the seebeck effect. In detail, the semiconductor layer 200 may generate the electromotive force when a temperature difference occurs at both ends thereof. In this case, a value of a product of a thermal conductivity of the semiconductor layer 200 and a thickness thereof may be less than that of the insulation layer 100. This is to reduce the thermal conduction property through the semiconductor layer 200. A voltage difference (i.e., an electromotive force) generated by a temperature difference between both ends of the thermoelectric element 10 is proportional to the temperature difference. When the thermal conduction property through the semiconductor layer 200 is high, the temperature difference between both ends may be lowered to deteriorate a thermoelectric performance.

Insulation layers 300 may be disposed on the semiconductor layer 200. The insulation layers 300 are spaced apart from each other in a first direction D1 parallel with one surface of the insulation substrate 100. The insulation layers 300 may have a thickness of about 10 nanometers to about 1000 nanometers.

The insulation layers 300 may include a material having an electric resistance greater than those of the semiconductor layer 200 and a metal thin film 400 which will be described later. For example, the insulation layers 300 may include at least one of silicon dioxide ($SiO_2$), aluminum oxide ($Al_2O_3$), titanium oxide ($TiO_2$), hafnium oxide ($HfO_2$), tungsten oxide (WO), and silicon nitride (SiN).

The insulation layers 300 may insulate a portion of the metal thin film 400 and the semiconductor layer 200. This is so that a flow of an electric charge progresses through the semiconductor layer 200 and the thin films 400 in both direction, which will be described layer. Also, the insulation layers 300 may be provided to prevent the electric charge from flowing backward due to a chemical potential difference between the metal thin film 400 and the semiconductor layer 200.

The metal thin films 400 may be disposed on the insulation layers 300. In detail, each of the metal thin films 400 may include a first part 410 and second parts 420. The first part 410 of the metal thin films 400 is disposed on one surface of the insulation layer 300 to overlap the insulation layer 300. The second part 420 of the metal thin films 400 extends from both ends of the first part 410 in the first direction D1 or in a direction opposite to the first direction D1 to be connected to a portion of the semiconductor layer 200. The metal thin films 400 may have a thickness of about 100 nanometers to about 10000 nanometers.

The metal thin films 400 may include at least one of platinum (Pt), titanium (Ti), cobalt (Co), nickel (Ni), tungsten (W), molybdenum (Mo), tantalum (Ta), manganese (Mn), iron (Fe), ruthenium (Ru), magnesium (Mg), erbium (Er), gold (Au), silver (Ag), and compounds thereof.

The metal thin films 400 may be provided to shunt a predetermined section of the semiconductor layer 200. That is, the current generated by the semiconductor layer 200 may flow in the section through the metal thin films 400.

The metal thin films 400 may be spaced apart form each other. In detail, since the metal thin films 400 adjacent to each other have the second parts 420 facing and being spaced apart from each other, a portion of the semiconductor layer 200 between the insulation layers 300 may be exposed. A distance between the second parts 420, which face each other, of the metal thin films 400 may be about 10 nanometers to about 100 nanometers. When a distance between the second parts 420 is greater than the above-described range of distance, an electric charge introduced from the second part 420 of a metal thin layer 400 to the semiconductor layer 200 may be in a thermal equilibrium state in the semiconductor layer 200. This may prevent the electric charge introduced to the semiconductor layer 200 from moving to the other metal thin layer 400 adjacent thereto, thereby reducing the efficiency of the thermoelectric element (10). When a distance between the second parts 420 is less than the above-described range of distance, an electrical short circuit may occur between the second parts 420 of the metal thin films 400 adjacent to each other.

A metal-semiconductor compound layer 500 may be disposed between the second parts 420 and the semiconductor layer 200. In a plan view, the metal-semiconductor compound layer 500 may be disposed on both sides of the insulation layer 300 in the first direction D1. That is, the metal-semiconductor compound layer 500 may be disposed on an area through which the metal thin film 400 and the semiconductor layer 200 are connected to each other. In this case, the metal-semiconductor compound layer 500 may have a portion having a buried shape in the semiconductor layer 200, but an embodiment of the inventive concept is not limited thereto. The metal-semiconductor compound layer 500 may have a thickness of about 1 nanometer to about 100 nanometers.

The metal-semiconductor compound layer 500 may include a compound of a material forming the semiconductor layer 200 and a material forming the metal thin layer 400. For example, the metal-semiconductor compound layer 500 may include a metal silicide such as PtSi, $TiSi_2$, Co2Si, CoSi, $CoSi_2$, NiSi, $NiSi_2$, $WSi_2$, $MoSi_2$, $TaSi_2$, $MnSi_x$, $FeSi_2$, $Ru_2Si_3$, $Mg_2$(Si, Sn), ErSi, AuSi or AgSi.

The metal-semiconductor compound layer 500 may be provided to reduce the Schottky barrier by a junction of the thin film layer 400 and the semiconductor layer 200 in the flow of electric charges passing through the metal thin film 400 and the semiconductor layer 200 in both directions. Also, the metal-semiconductor compound layer 500 may form a selective barrier according to an energy level of an electric charge, thereby allowing only the electric charge having high energy to pass through the metal-semiconductor compound layer 500. When the electric charges passing through the energy barrier have a high average energy, the seebeck coefficient may be improved to increase the thermoelectric element figure of merit calculated from Equation 1.

$$ZT = \frac{S^2 \sigma}{\kappa} T \qquad \text{[Equation 1]}$$

where ZT is a figure of merit, S is a seebeck coefficient, σ is an electric conductivity, κ is a thermal conductivity, and T is an absolute temperature.

Figure 3A:
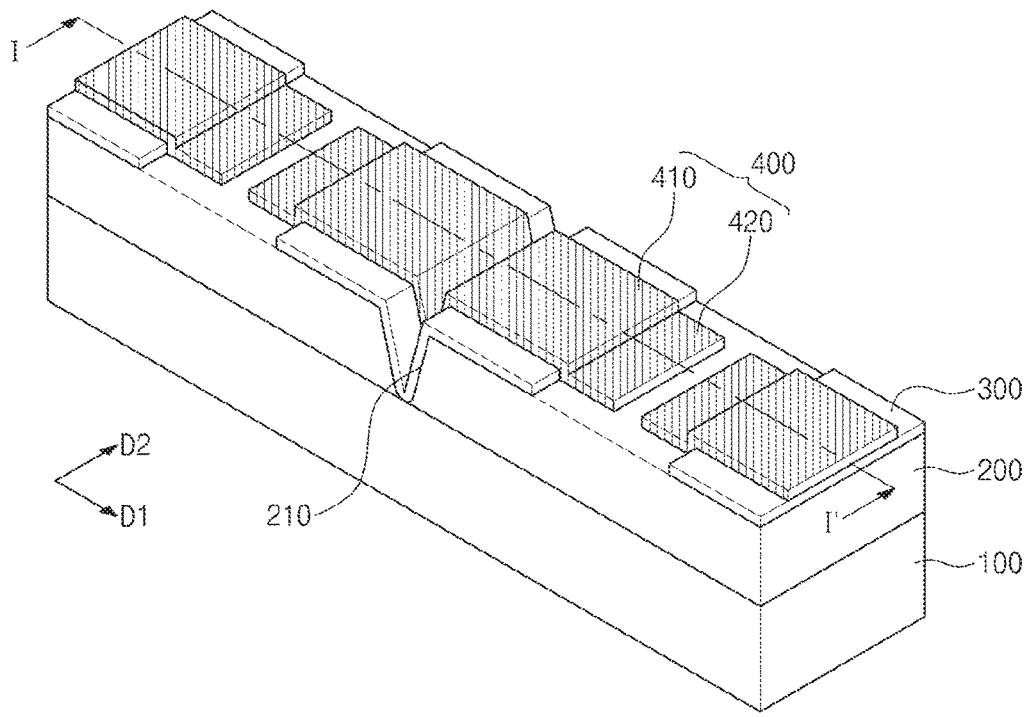
FIGS. 3A and 4A are perspective views illustrating other embodiments of the inventive concept.
Figure 3B:
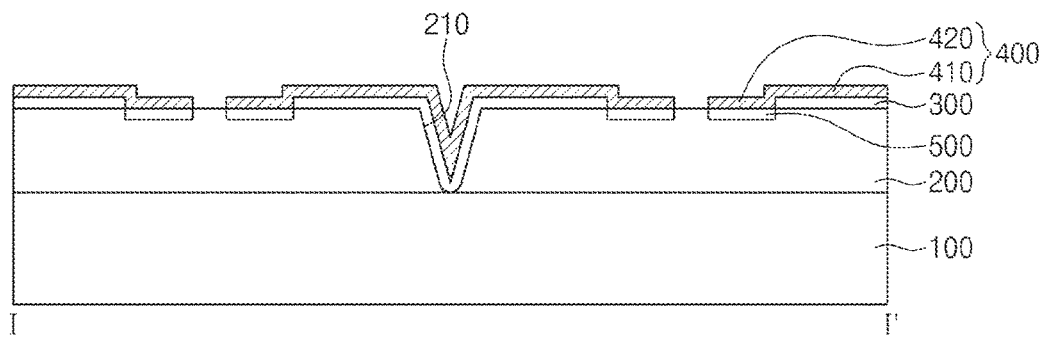
FIGS. 3B and 4B are cross-sectional views taken along line I-I' of FIGS. 3A and 4A, respectively.
Figure 4A:
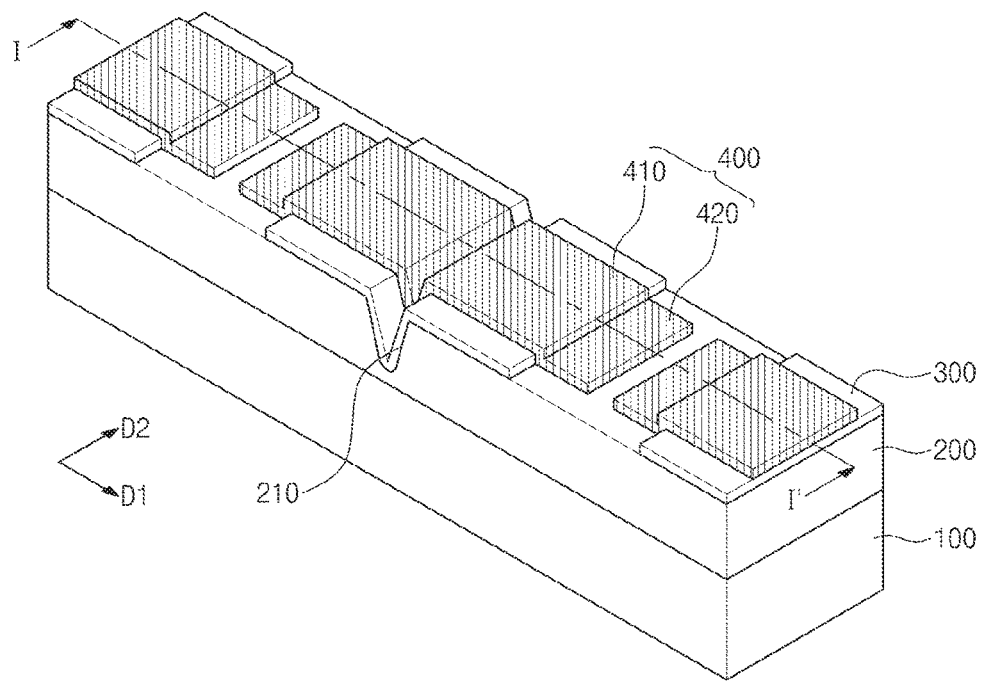
Figure 4B:
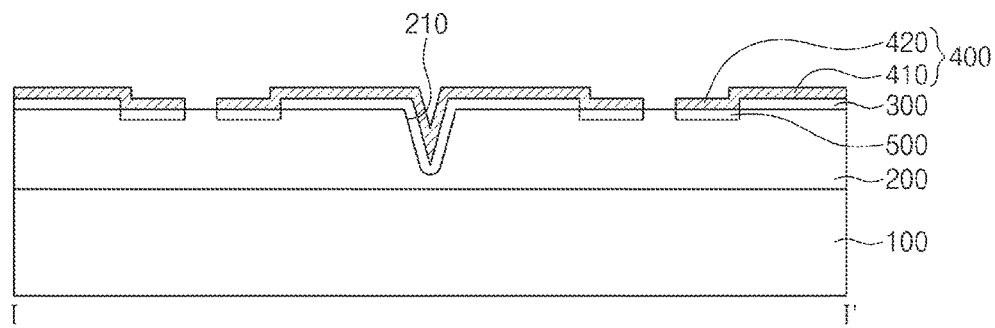

FIGS. 3A and 4A are perspective views illustrating other embodiments of the inventive concepts, and FIGS. 3B and 4B are cross-sectional views taken along line I-I' of FIGS. 3A and 4A, respectively. For convenience of description, differences with the foregoing embodiment or unexplained points in the forgoing embodiment will be mainly described, and omitted descriptions will be derived from the foregoing embodiment.

Referring to FIGS. 3A and 3B, a semiconductor layer 200 may have trenches 210 therein. In detail, the trenches 210 may be disposed from a surface of the semiconductor layer 200 in a direction of the inside thereof. The trenches 210 may extent in a second direction D2 crossing a first direction D1. The trenches 210 may traverse first parts 410 of metal thin films 400. That is, an insulation layer 300 and the metal thin layer 400 may cross the trenches 210 as viewed in a plane. In this case, the insulation layers 300 and the metal thin layers 400 disposed on the semiconductor layer 200 may cover an inner surface of the trenches 210. The semiconductor layer 200 may be separated by the trenches 210. That is, the trenches 210 may pass through the semiconductor layer 200 to expose a portion of an insulation substrate 100 as illustrated in FIGS. 3A and 3B.

Alternatively, the semiconductor layer 200 may not be separated by trenches 210. That is, the trenches 210 may not completely pass through a semiconductor layer 200 as illustrated in FIGS. 4A and 4B.

The trenches 210 may be provided to prevent electric charges from being leaked through the semiconductor layer 200 without flowing through the metal thin film 400 and the semiconductor layer 200 in both directions. Also, the trenches 210 may be provided to reduce a thermal conduction property through the semiconductor layer 200. When the thermal conduction property through the semiconductor layer 200 is high, a temperature difference between both ends may be lowered to deteriorate a thermoelectric performance.

Figure 5:
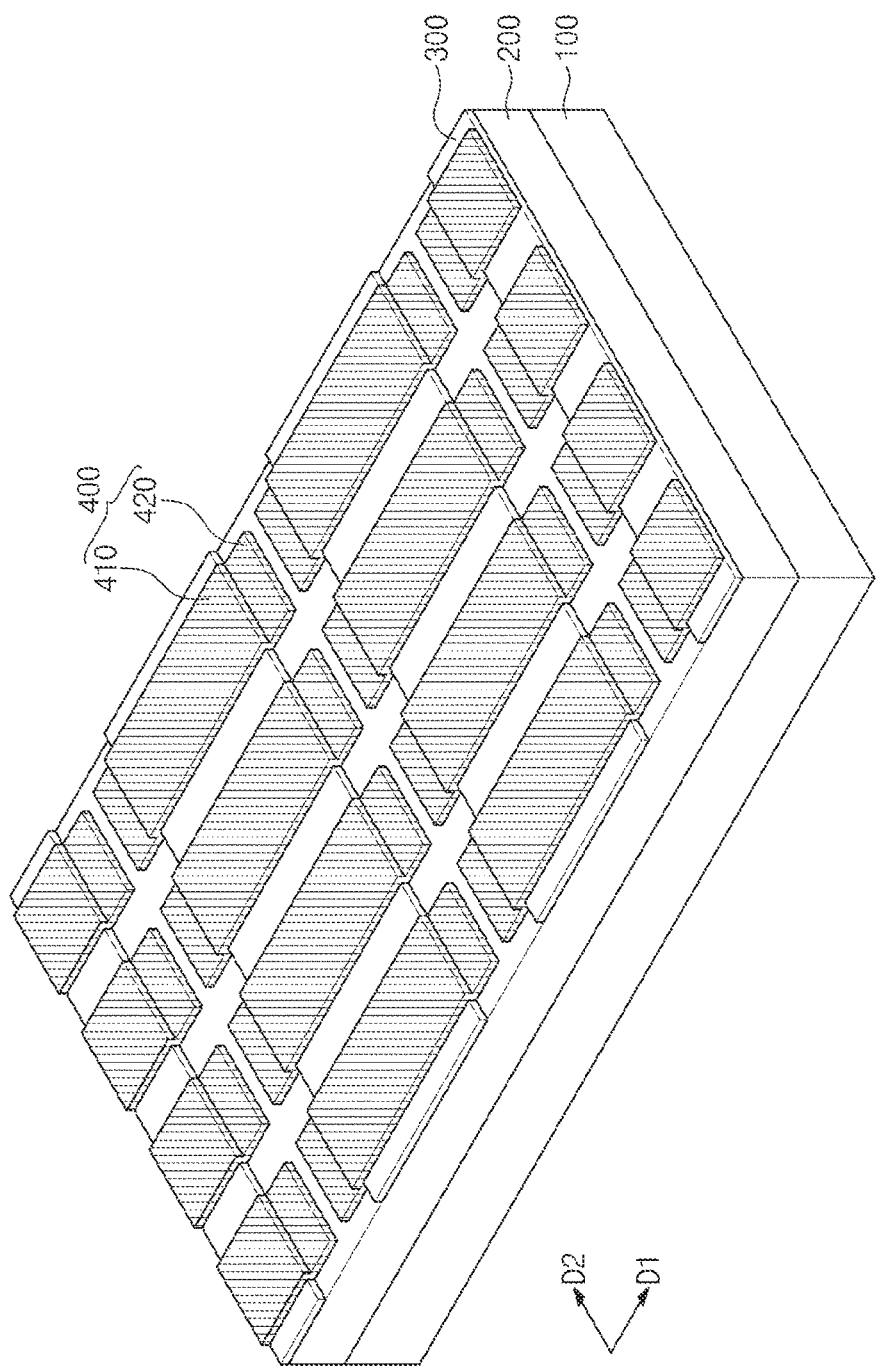
FIG. 5 is a perspective view illustrating a thermoelectric element according to further embodiments of the inventive concept.

FIG. 5 is a perspective view illustrating a thermoelectric element according to further embodiments.

Referring to FIG. 5, a thermoelectric element may include a plurality of metal thin films. In detail, the metal thin films 400 are disposed in a first direction D1 and a second direction D2 to form a plurality of rows and columns. In this case, the metal thin films 400 and the metal thin film 400 adjacent thereto in the second direction D2 may be electrically insulated with each other.

Insulation layers 300 may extend in the second direction D2. For example, the insulation layers 300 may have a line shape extending in the second direction D2. That is, each of the metal thin films 400 adjacent to each other in the second direction D2 may overlap one insulation layer 300 extending in the second direction D2. However, an embodiment of the inventive concept is not limited thereto. For example, the insulation layers 300 may be separated to each other.

The thermoelectric element according to embodiments of the inventive concept may have the metal thin film to improve the electric conductivity in an upper portion of the semiconductor layer, and may form the selective barrier according to the energy level of the electric charge through the metal-semiconductor compound layer formed on an interface between the semiconductor layer and the metal thin film. Through this, a heat transfer by an electric charge, which has a low level of energy and reduces efficiency of the thermoelectric element, may be reduced, and an electric charge, which has a high level of energy and contributes the thermoelectric performance, may selectively be passed through.

Also, the semiconductor layer of the thermoelectric element may have the trench formed in a direction vertical to a temperature gradient between both ends of the thermoelectric element, and this may reduce the thermal conduction property between both ends of the thermoelectric element to improve the thermoelectric efficiency.

Figure 6:
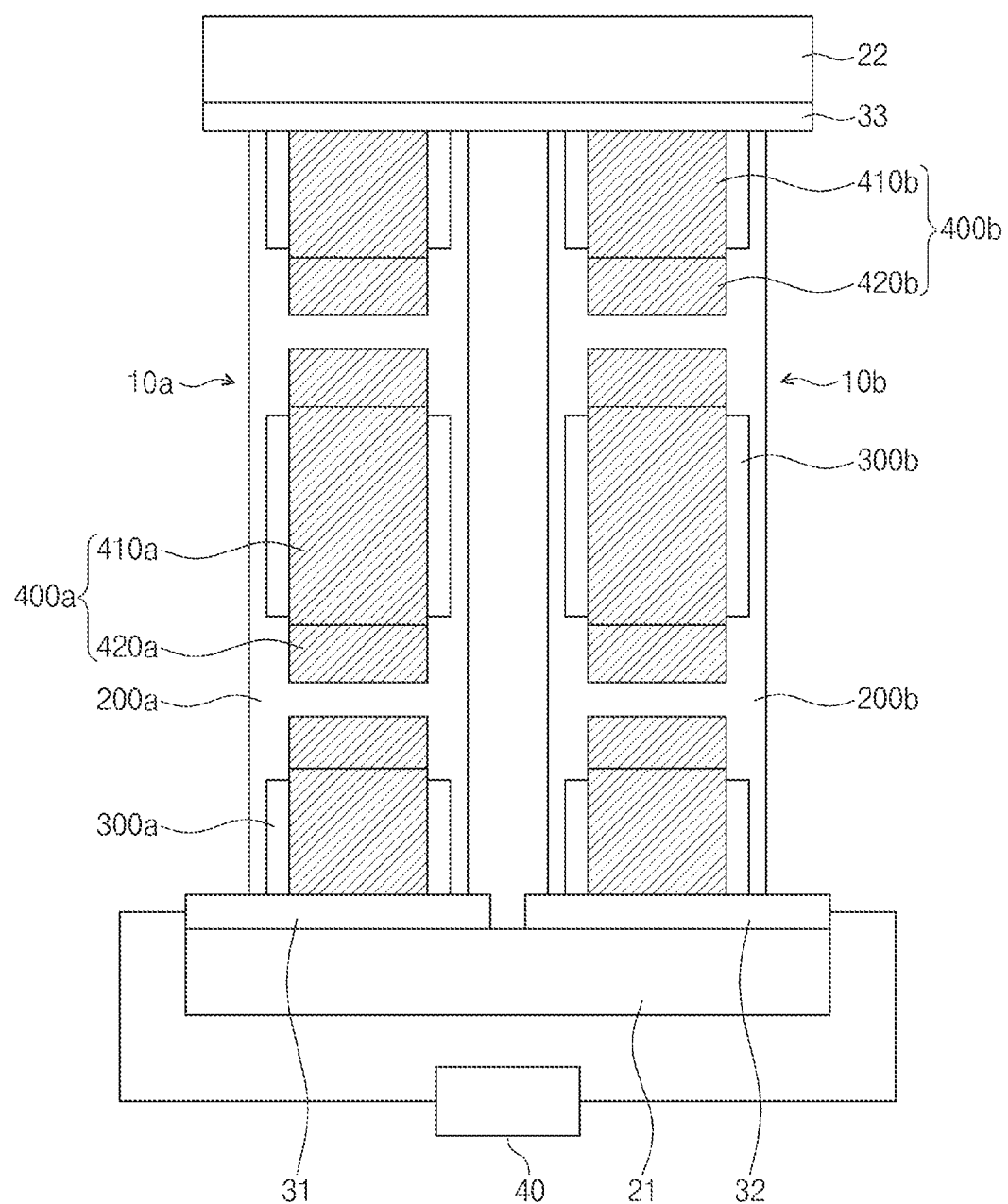
FIG. 6 is a cross-sectional view illustrating a thermoelectric module including a thermoelectric element according to embodiments of the inventive concept.

FIG. 6 is a cross-sectional view illustrating a thermoelectric module including a thermoelectric element according to embodiments of the inventive concept.

Referring to FIG. 6, a first substrate 21 may be provided. For example, the first substrate 21 may be a ceramic substrate formed of aluminum oxide (Al2O3) or aluminum nitride (AlN).

A first electrode 31 and a second electrode 32 may be disposed on the first substrate 21. The first electrode 31 and the second electrode 32 may be disposed to be spaced apart from each other. The first electrode 31 and the second electrode 32 may be metal electrodes. For example, the first electrode 31 and the second electrode 32 may include copper (Cu).

A first leg 10a may be disposed on the first electrode 31. The first leg 10a may be the thermoelectric element according to an embodiment of the inventive concept. A metal thin film 400a on a side of the first leg 10a may be electrically connected to the first electrode 31. A second leg 10b may be disposed on the second electrode 32. The second leg 10b may be the thermoelectric element according to an embodiment of the inventive concept. A metal thin film 400b on a side of the second leg 10b may be electrically connected to the second electrode 32. In this case, the first leg 10a and the second leg 10b may have conductive types different from each other. For example, the first leg 10a may be a thermoelectric element having an n-type conductive semiconductor layer 200a. For example, the second leg 10b may be a thermoelectric element having a p-type conductive semiconductor layer 200b. The first leg 10a and the second leg 10b may generate an electromotive force between both ends thereof in which a temperature gradient exists.

A third electrode 33 may be disposed on the first leg 10a and the second leg 10b. The third leg 33 may electrically connect the first leg 10a and the second leg 10b. For example, the third leg 33 may be electrically connected to the metal thin film 400a on the side of the first leg 10a, and electrically connected to the metal thin film 400b on the side of the second leg 10b. The third electrode 33 may be a metal electrode. For example, the third electrode 33 may include Cu.

A second substrate 22 may be disposed on the third electrode 33. For example, the second substrate 22 may be a ceramic substrate formed of aluminum oxide ($Al_2O_3$) or aluminum nitride (AlN). Each of the first substrate 21 and the second substrate 22 may be connected to each of a high temperature part and a low temperature part to generate a temperature gradient between both ends of the first leg 10a and the second leg 10b.

A thermoelectric module may be provided in plurality to form an array with another thermoelectric module adjacent thereto. For example, a first electrode 31 of a thermoelectric module may be electrically connected to a second electrode 32 of another thermoelectric module adjacent thereto. Third electrodes 33 of the plurality of thermoelectric modules may be electrically insulated from each other.

The thermoelectric module may generate current by using thermal energy. As illustrated in FIG. 6, the thermoelectric module may further include an external device 40 which is connected to the first and second electrodes 31 and 32 to build a circuit, and the external device 40 may be resistor element. The first and second legs 10a and 10b may generate an electromotive force so that current flows in the external device 40.

In a similar principle, when the external device 40 of the thermoelectric module functions as a power source to generate a flow of current, the thermoelectric module may be used as a thermoelectric cooler by discharging heat from the high temperature part to the low temperature part. Alternatively, a flow of heat may be reversed by changing the polarity of the power source.

The thermoelectric element according to embodiments of the inventive concept may have the metal thin film to improve the electrical conductivity on the semiconductor layer, and may form the selective barrier according to the energy level of the electric charge through the metal-semiconductor compound layer formed at an interface between the semiconductor layer and the metal thin film. Through this, the heat transfer by the electric charge, which has a low level of energy and reduces efficiency of the thermoelectric element, may be reduced, and the electric charge, which has a high level of energy and contributes the thermoelectric performance, may be allowed to selectively pass through.

Also, the semiconductor layer of the thermoelectric element may include the trench formed in a direction vertical to a direction of a temperature gradient between both ends of the thermoelectric element, and this trench may reduce the thermal conduction between both ends of the thermoelectric element to improve the thermoelectric efficiency.

Although the embodiments of the inventive concept are described with reference to the accompanying drawings, those with ordinary skill in the technical field to which the inventive concept pertains will be understood that the present disclosure can be carried out in other specific forms without changing the technical idea or essential features.

Thus, the above-described embodiments are to be considered illustrative and not restrictive to all aspects.

What is claimed is:

1. A thermoelectric element comprising:
   an insulation substrate;
   a semiconductor layer on the insulation substrate, the semiconductor layer having a single conductive type, the single conductive type being n-type or p-type;
   insulation layers disposed on the semiconductor layer and spaced apart from each other in a first direction parallel with a surface of the insulation substrate;
   a plurality of metal thin films disposed on the insulation layers, the plurality of metal thin films overlapping the semiconductor layer having the single conductive type, wherein each of the metal thin films comprises a first part overlapping the insulation layer and a second part extending from the first part in the first direction or in a direction opposite to the first direction to be connected to the semiconductor layer; and
   metal-semiconductor compound layers between the semiconductor layer and the second parts,
   wherein the second parts facing each other in the metal thin films adjacent to each other are spaced apart from each other.

2. The thermoelectric element of claim 1, wherein the insulation layers extend in a second direction crossing the first direction, and the metal thin films are disposed in the first and second directions to form a plurality of rows and columns.

3. The thermoelectric element of claim 1, wherein the semiconductor layer comprises trenches that are formed thereinside and extend in a second direction crossing the first direction to traverse the first parts of the metal thin films in a plan view.

4. The thermoelectric element of claim 3, wherein the trench penetrates through the semiconductor layer to expose a surface of the insulation substrate.

5. The thermoelectric element of claim 1, wherein the semiconductor layer has a thickness of about 0.1 to about 30 micrometers.

6. The thermoelectric element of claim 1, wherein the second parts facing each other are spaced apart from each other at a distance of about 10 to 100 nanometers.

7. The thermoelectric element of claim 1, wherein the semiconductor layer comprises silicon (Si), and the metal thin films comprise at least one of platinum (Pt), titanium (Ti), cobalt (Co), nickel (Ni), tungsten (W), molybdenum (Mo), tantalum (Ta), manganese (Mn), iron (Fe), ruthenium (Ru), magnesium (Mg), erbium (Er), gold (Au), silver (Ag), or compounds thereof.

8. The thermoelectric element of claim 7, wherein the metal-semiconductor compound layers comprise a metal silicide.

9. A thermoelectric module comprising:
   a first substrate;
   a first electrode and a second electrode disposed on the first substrate;
   a first leg disposed on the first electrode, which;
   a second leg disposed on the second electrode;
   a third electrode disposed on the first leg and the second leg; and
   a second substrate disposed on the third electrode,
   wherein each of the first and second legs comprises the thermoelectric element of claim 1, wherein the semiconductor layer of the first leg and the semiconductor layer of the second leg have conductive types different from each other.

10. The thermoelectric element of claim 1, wherein a lower surface of the semiconductor layer comes in direct contact with the insulation substrate.

11. The thermoelectric element of claim 1, wherein the insulation layers are sandwiched between the metal thin films and the semiconductor layer, with a bottom surface of each of the insulation layers abutting a top surface of the semiconductor layer, and the insulation layers, when taken from a plan view, are spaced apart from each other.

12. The thermoelectric element of claim 1, wherein the semiconductor layer has a first spot and a second spot apart from the first spot in the first direction, the first spot being connected to one of the metal thin films, the second spot being connected to an adjacent one of the metal thin films, and
   wherein electric charge introduced from the said one of the metal thin films moves from the first spot to the second spot of the semiconductor layer in a direction perpendicular to a thickness direction of the semiconductor layer.

* * * * *